(12) United States Patent
Willigan et al.

(10) Patent No.: US 9,865,766 B2
(45) Date of Patent: Jan. 9, 2018

(54) ULTRAVIOLET PHOTODETECTORS AND METHODS OF MAKING ULTRAVIOLET PHOTODETECTORS

(71) Applicant: Carrier Corporation, Farmington, CT (US)

(72) Inventors: Rhonda R. Willigan, Manchester, CT (US); Jose L. Santana, Vernon, CT (US); Marcin Piech, East Hampton, CT (US); Joseph V. Mantese, Ellington, CT (US)

(73) Assignee: Carrier Corporation, Farmington, CT (US)

( * ) Notice: Subject to any disclaimer, the term of this patent is extended or adjusted under 35 U.S.C. 154(b) by 0 days.

(21) Appl. No.: 15/217,952

(22) Filed: Jul. 22, 2016

(65) Prior Publication Data

US 2017/0033256 A1 Feb. 2, 2017

Related U.S. Application Data

(60) Provisional application No. 62/198,029, filed on Jul. 28, 2015.

(51) Int. Cl.
*H01L 31/18* (2006.01)
*C01G 9/00* (2006.01)
(Continued)

(52) U.S. Cl.
CPC .......... *H01L 31/1832* (2013.01); *C01G 9/006* (2013.01); *C09D 1/00* (2013.01);
(Continued)

(58) Field of Classification Search
CPC ............ C23C 18/1216; C23C 18/1225; C23C 18/1275; C23C 18/1279; G01J 1/429;
(Continued)

(56) References Cited

U.S. PATENT DOCUMENTS 4,090,177 A   5/1978   Urata et al.
5,339,070 A   8/1994   Yalowitz et al.
(Continued)

FOREIGN PATENT DOCUMENTS

CN   1400674 A     3/2003
CN   100358159 C   12/2007
(Continued)

OTHER PUBLICATIONS

Ogawa et al. ("Blue luminescence of MgZnO and CdZnO films deposited at low temperatures," J. Electrochem. Soc. 154, J283 2007).*

(Continued)

*Primary Examiner* — Yasser A Abdelaziez
(74) *Attorney, Agent, or Firm* — Locke Lord LLP; Scott D. Wofsy; Christopher J. Cillié

(57) ABSTRACT

A method of making an ultraviolet sensor includes applying a metal-containing solution to a substrate using a spin coating technique to form a metal-containing coat. The metal-containing coat is baked and pyrolyzed to form a metal-containing oxide film on the substrate. The metal-containing oxide film has a cubic crystalline structure suitable for ultraviolet photodetectors in flame detection applications.

35 Claims, 6 Drawing Sheets

(51) Int. Cl.
*C09D 1/00* (2006.01)
*C09D 5/24* (2006.01)
*C09D 5/32* (2006.01)
*C23C 18/12* (2006.01)
*G01J 1/42* (2006.01)

(52) U.S. Cl.
CPC .............. *C09D 5/24* (2013.01); *C09D 5/32* (2013.01); *C23C 18/1216* (2013.01); *C23C 18/1225* (2013.01); *C23C 18/1275* (2013.01); *C23C 18/1279* (2013.01); *H01L 31/1864* (2013.01); *G01J 1/429* (2013.01)

(58) Field of Classification Search
CPC ... C09D 5/32; C09D 1/00; C09D 5/24; C01G 9/006; H01L 31/1864; H01L 31/1832
See application file for complete search history.

(56) References Cited

U.S. PATENT DOCUMENTS

| | | | |
|---|---|---|---|
| 5,494,700 | A | 2/1996 | Anderson et al. |
| 5,699,035 | A | 12/1997 | Ito et al. |
| 5,830,412 | A | 11/1998 | Kimura et al. |
| 6,166,647 | A | 12/2000 | Wong |
| 6,239,435 | B1 | 5/2001 | Castleman |
| 6,255,651 | B1 | 7/2001 | Laluvein et al. |
| 6,358,378 | B2 | 3/2002 | Choi et al. |
| 6,518,077 | B2 | 2/2003 | Narayan et al. |
| 6,621,192 | B2 | 9/2003 | Lu et al. |
| 6,846,731 | B2 | 1/2005 | Lu et al. |
| 7,132,668 | B2 | 11/2006 | Vispute et al. |
| 7,172,813 | B2 | 2/2007 | Burgener, II et al. |
| 7,202,794 | B2 | 4/2007 | Huseynov et al. |
| 7,333,910 | B2 | 2/2008 | Ishii |
| 7,432,024 | B2 | 10/2008 | Talin et al. |
| 7,541,938 | B1 | 6/2009 | Engelhaupt |
| 7,566,875 | B2 | 7/2009 | Starikov et al. |
| 7,767,253 | B2 | 8/2010 | Sharma |
| 8,536,618 | B2 | 9/2013 | Richardson et al. |
| 8,878,157 | B2 | 11/2014 | Wu et al. |
| 8,926,317 | B2 | 1/2015 | Farrell et al. |
| 2006/0183249 | A1 | 8/2006 | Yao et al. |
| 2008/0036593 | A1 | 2/2008 | Rose-Pehrsson et al. |
| 2010/0276003 | A1 | 11/2010 | Kawano et al. |
| 2011/0259080 | A1 | 10/2011 | Ratcliffe et al. |
| 2012/0001760 | A1 | 1/2012 | Harchanko |
| 2013/0092933 | A1 | 4/2013 | Nakamura |
| 2013/0341619 | A1 | 12/2013 | Nakamura |
| 2014/0284598 | A1 | 9/2014 | Boutwell et al. |
| 2014/0287147 | A1 | 9/2014 | Bartl et al. |
| 2014/0319317 | A1 | 10/2014 | Lai et al. |
| 2015/0022592 | A1 | 1/2015 | Aoyama et al. |
| 2015/0171257 | A1 | 6/2015 | Maekawa et al. |
| 2016/0020036 | A1* | 1/2016 | Murata .................. H01G 9/035 361/509 |

FOREIGN PATENT DOCUMENTS

| | | |
|---|---|---|
| CN | 101210313 A | 7/2008 |
| CN | 101285147 A | 10/2008 |
| CN | 101285173 A | 10/2008 |
| CN | 101286535 A | 10/2008 |
| CN | 100561742 C | 11/2009 |
| CN | 101807619 A | 8/2010 |
| CN | 101866983 A | 10/2010 |
| CN | 101935876 A | 1/2011 |
| CN | 101969023 A | 2/2011 |
| CN | 102110735 A | 6/2011 |
| CN | 201964955 U | 9/2011 |
| CN | 102569483 A | 7/2012 |
| CN | 102694053 A | 9/2012 |
| CN | 202633358 U | 12/2012 |
| CN | 103205706 A | 7/2013 |
| CN | 103219418 A | 7/2013 |
| CN | 103258869 A | 8/2013 |
| CN | 103346171 A | 10/2013 |
| CN | 103346199 A | 10/2013 |
| CN | 103441154 A | 12/2013 |
| CN | 103441186 A | 12/2013 |
| CN | 103545397 A | 1/2014 |
| CN | 103915524 A | 7/2014 |
| CN | 103972310 A | 8/2014 |
| CN | 104504838 A | 4/2015 |
| CN | 104617180 A | 5/2015 |
| GB | 2222908 | 3/1990 |
| JP | 2006278487 A | 10/2006 |
| JP | 2013-004674 A | 1/2013 |
| KR | 101009532 B1 | 1/2011 |
| KR | 101192934 B1 | 10/2012 |
| WO | WO-2010091703 A1 | 8/2010 |

OTHER PUBLICATIONS

Sonawane et al. ("Synthesis and characterization of nanocrystalline $Mg_xZn_{1-x}O$ films deposited by spin coating method", Journal of Optoelectronics and Advanced Materials, vol. 11, No. 11, p. 1843-1847, Nov. 2009).*

<http://ieeexplore.ieee.org/xpl/article>*titled A Fire Detecting Method Based on Multi-Sensor Data Fusion by Shaohau Chen, Hong Bao, Xianyun Zeng, Yimin Yang, Faculty of Automation, Guangdong University ofTechnology*, Guangzhou, 510090, P.R. China, bhongg163.net <http://bhongg163.net>.

<http://www.tradeindia.com/fp1824652/IR-UV-Flame-Detector.html,> ESP Safety Pvt. Ltd, Description/Specification of IR/UV Flame Detector.

<https://www.google.co.in>, Open Access algorithms ISSN 1999-4893 www.mdpi.com/journal <http://www.mdpi.com/journal> algorithms, Article in Algorithms 2014, 7, 523; doi:10.3390/a7040523 titled "Multi-Sensor Building Fire Alarm System with Information Fusion Technology Based on D-S Evidence Theory" by Qian Ding, Zhenghong Peng, Tianzhen Liu and Qiaohui Tong, School of Urban Design, Wuhan University, Bayi Road 16, Wuhan 430072, Hubei, China.

Extended European Search Report dated Dec. 19, 2016, issued from European Patent Office in corresponding European Patent Application No. 16181769.7.

Suo Bai et al.: "High-Performance Integrated ZnO Nanowire UV Sensors on Rigid and Flexible Substrates", Advanced Functional Materials, Wiley—V C H Verlag Gmbh & Co. KGAA, DE, vol. 21, No. 23, Dec. 6, 2011 (Dec. 6, 2011), pp. 4464-4469, XP001571417, ISSN: 1616-301X, DOI: 10.1002/ADFM.201101319.

Abdelrahim Ate et al: "Ultrafast and High Sensitive UV/IR Photodetector Based on a Single $SnO_2$ Nanowire", International Journal of Optoelectronic Engineering, Jan. 1, 2014 (Jan. 1, 2014), pp. 6-10, XP055326489, 001: 10.5923/j.ijoe.20140401.02.

Yanjun Zhang et at: "High performance ultraviolet photodetectors based on an individual $Zn_2SnO_4$ single crystalline nanowire",Journal of Materials Chemistry, vol. 20, No. 44, Jan. 1, 2010 (Jan. 1, 2010), p. 9858, XP055326623,GB ISSN: 0959-9428, DOI: 10.1039/c0jm02872j.

H. Zhu et at: "Metal-Oxide-Semiconductor-Structured MgZnO Ultraviolet Photodetector with High Internal Gain", Journal of Physical Chemistry C, vol. 114, No. 15, Apr. 22, 2010 (Apr. 22, 2010), pp. 7169-7172, XP055326648, ISSN: 1932-7447, DOI: 10.1021/jp101083n.

Lee Keun et at: "Photosensitivity of solution-based indium gallium zinc oxide single-walled carbon nanotubes blend thin film transistors", Applied Physics Letters, A I P Publishing LLC, US, vol. 94, No. 10, Mar. 13, 2009 (Mar. 13, 2009), pp. 102112-102112,XP012118314, ISSN: 0003-6951, DOI: 10.1063/1.3098406.

M.M. Fan et al.: "High-performance solar-blind ultraviolet photodetector based on mixed-phase ZnMqO thin film", Applied Physics Letters 105, 011117 (2014).

M. Wei, et al.: "Characteristics of ZnMgO thin films prepared by the Sol-gel method," Advanced Materials Research, 1662-8985, vols. 60-61, pp. 110-113, Jan. 20, 2009.

(56) References Cited

OTHER PUBLICATIONS

M. Caglar, et al.: "MgxZn1-x0 (x=0-1) *films fabricated by sol-gel spin coating,*" Materials Reserach Bulleting 45, (2010), pp. 284-287.
Extended Search Report in connection with EP16181490.0 dated Jan. 4, 2017.
Y. N. Hou, et al.: "Monolithic color-selective ultraviolet (266-315 nm) photodetector based on a wurtzite MgxZn1-x0 film," Applied Physics Letters 105, 133510 (2014).
K. Hoggas, et al.: "Structural, microstructural, and optical properties of Zn1-xMgx0 thin films grown onto glass substrate by ultrasonic spray pyrolysis," Applied Physics A (2015) 120:745-755.
Partial Search report dated Jan. 5, 2017 in connection with EP Application No. EP16181398.5.
Chu T. T. et al.,: "Characterization of UV photodetectors with Mg"xZn" 1"@?" x0 thin fims," Microelectronic Engineering, Elsevier Publishers BV., Amsterdam, NL, vol. 87, No. 9, Nov. 1, 2010, pp. 1777-1780.
S. S. Hullavarad et al.,: "Realization of Mg(x=0.15)Zn(1-x=0.85)O-based metal-semiconductor-metal UV detector on quartz and sapphire," J. Vac. Sci. Technol. A23(4), Jul./Aug. 2005, American Vacuum Society, pp. 982-985.
H. Zuopeng, et al.: "Fabrication and characterization of MgxNi1-x1 thin fims by sol-gel dip-coating," Chinese Journal of Semiconductors, vol. 26, Issue 4, Apr. 2005, pp. 721-725 with English abstract.
European Search Report received from the European Patent Office dated Apr. 5, 2017 for Application No. EP16181398.

\* cited by examiner

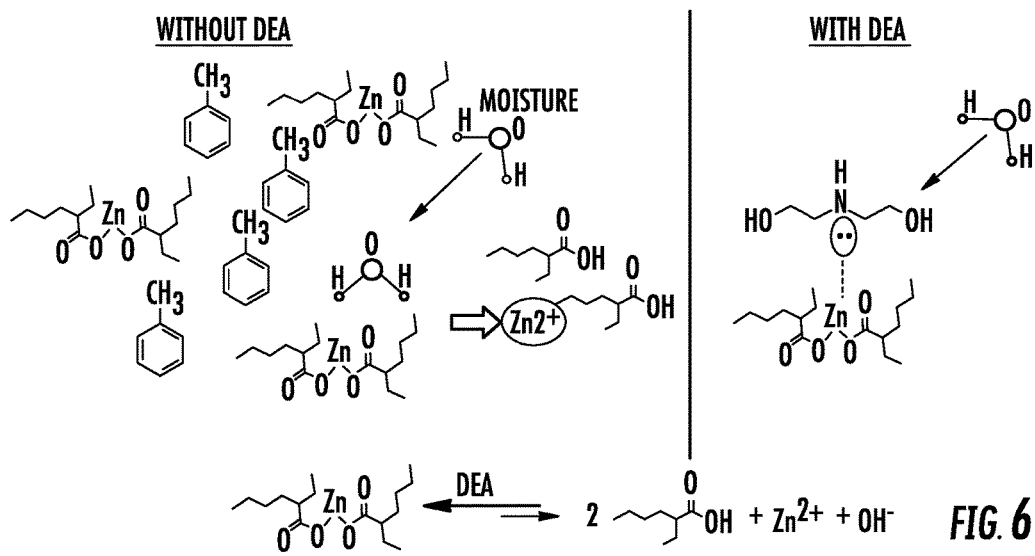
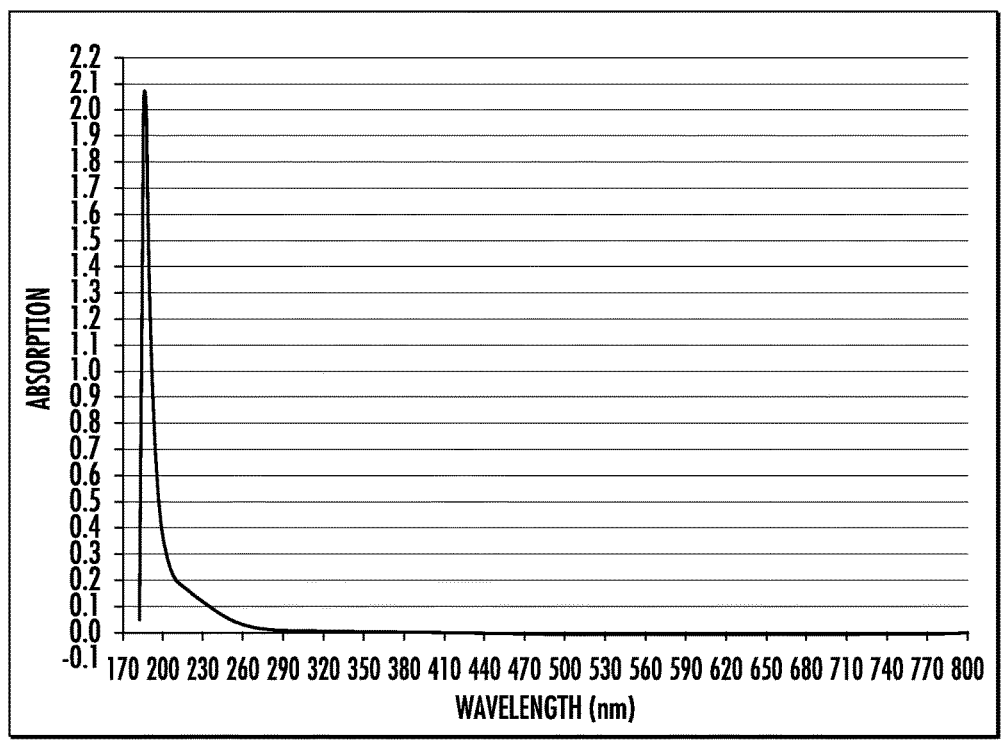
FIG. 7

ULTRAVIOLET PHOTODETECTORS AND METHODS OF MAKING ULTRAVIOLET PHOTODETECTORS

CROSS-REFERENCE TO RELATED APPLICATION

This application claims the benefit of priority under 35 U.S.C. §119(e) to U.S. Provisional Application No. 62/198,029, filed Jul. 28, 2015, which is incorporated herein by reference in its entirety.

BACKGROUND OF THE INVENTION

1. Field of the Invention

The present disclosure relates to photodetectors, and more particularly to ultraviolet (UV) photodetectors and methods of making UV photodetectors.

2. Description of Related Art

Ultraviolet (UV) photodetectors are commonly used in environmental monitoring applications to detect the appearance of a UV radiation source, such as flames and fire. Since UV radiation from flames and fire can reach a UV photodetector more quickly than other indicators of flame or fire may reach other types of detectors, UV photodetectors can provide indication of the appearance of the flame and fire in a monitored environment more rapidly than other types of detectors. UV photodetectors can include UV-sensitive film. The UV-sensitive film may have a large band gap, are solar blind, are stable, and are highly responsive to changes in the amount UV radiation present in a monitored environment. Semiconducting thin films are generally deposited using chemical vapor deposition (CVD), molecular beam epitaxy (MBE), or sputtering techniques. CVD, MBE, or sputtering techniques can render semiconducting thin films prohibitively expensive for applications like flame detectors because of the expense associated with the equipment typically required for depositing semiconducting thin films.

Such conventional UV photodetectors and methods of making UV photodetectors have generally been considered satisfactory for their intended purpose. However, there is still a need in the art for improved UV photodetectors and methods of making UV photodetectors. The present disclosure provides a solution for this need.

SUMMARY OF THE INVENTION

A method of making an ultraviolet (UV) photodetector includes applying a metal-containing solution to a substrate using a chemical solution deposition (CSD) technique to form a metal-containing coat. The metal-containing coat is baked to drive solvent from the metal-containing coat. The metal-containing coat is then pyrolyzed to form a metal-containing oxide film with a cubic crystalline structure throughout suitable for ultraviolet photodetectors in flame detection applications. In embodiments, the metal-containing oxide film includes magnesium and zinc in a ratio that corresponds to a ratio of magnesium to zinc in organometallic starting compounds included in the metal-containing solution.

In certain embodiments, pyrolyzing the metal-containing solution coat can include developing a metal-containing oxide film with a polycrystalline structure. The polycrystalline structure can include an amorphous crystalline structure, a cubic crystalline structure, or both amorphous and cubic crystalline structures. Pyrolyzing the metal-containing coat can include forming the metal-containing film without oxidizing or volatizing organic ligands present within the metal-containing coat. Pyrolyzing the metal-containing coat can include flowing an inert gas over the metal-containing coat while the metal-containing oxide layer is pyrolyzed. The inert gas can include argon, nitrogen, or any other suitable inert gas. Pyrolyzing the metal-containing coat can include placing the metal-containing coat in a furnace for a predetermined pyrolyzing time interval after the furnace has been preheated to a predetermined pyrolyzing temperature. The pyrolyzing time interval can be between five (5) and thirty minutes. The pyrolyzing temperature can be between about 450 and 550 degrees Celsius. The metal-containing oxide film can be quenched after undergoing pyrolysis.

In accordance with certain embodiments, the method can include calcining the metal-containing oxide film. Calcining can be done in an oxygen rich atmosphere, such as an atmosphere containing 20% or more oxygen mixed with an inert gas. Calcining the metal-containing oxide film can include removing interstitial zinc, such as by oxidizing the interstitial zinc disposed within the lattice of the metal-containing oxide film. Calcining the metal-containing oxide film can include placing the metal-containing oxide film in a furnace for a predetermined calcining interval after the furnace has been preheated to a predetermined calcining temperature. The calcining time interval can be between about ten (10) and thirty (30) minutes. The calcining temperature can be between about 650 and 750 degrees Celsius. It is also contemplated that calcining the metal-containing oxide film can include fully developing a cubic crystalline structure throughout the metal-containing oxide film such that substantially no hexagonal (wurtzite) crystalline structure is present in the metal-containing oxide layer.

It is also contemplated that, in accordance with certain embodiments, the method can include annealing the metal-containing oxide layer. The annealing can include a low-temperature anneal and can be done subsequent to calcining the metal-containing oxide film to form the metal-containing oxide layer. The low-temperature anneal can develop a cubic crystalline microstructure within the metal-containing oxide layer, such as by fully developing a cubic crystalline microstructure throughout the metal-containing oxide layer by removing or converting a non-cubic portion of the crystalline structure remaining in the metal-containing oxide layer subsequent to calcining. The metal-containing oxide layer can be quenched after undergoing calcining.

In embodiments, the CSD technique can include applying the metal-containing solution to the substrate using a spin coat technique, a dip coat technique, an aerosol coat technique, or any other suitable CSD technique. The spin coat technique can include flooding the substrate with the metal-containing solution and then spinning the flooded substrate and metal-containing solution at a predetermined coat speed for a predetermined coat interval. In an exemplary embodiment, the flooded substrate is spun at about 1,500 rotations per minute for thirty (30) seconds to develop a metal-containing coat that, after pyrolyzing and calcining, has a thickness of between about twenty-five (25) and about fifty (50) nanometers.

In accordance with certain embodiments, the metal-containing coat can be gently baked subsequent to spin coating. Baking the metal-containing coat can be done prior to pyrolyzing the metal-containing coat. The metal-containing coat can be baked at a predetermined bake temperature that is less than the predetermined pyrolyzing temperature. Baking the metal-containing coat can include driving the solvent out of the metal-containing coat. Baking the metal-containing coat can include, for example, placing the metal-containing coat on a hot plate for a predetermined temperature for a predetermined time interval.

It is contemplated that, in accordance with certain embodiments, the method can include developing a film stack with a plurality of metal-containing oxide films on the substrate prior to calcining the film stack. For example, subsequent to applying a first metal-containing solution to form a first metal-containing coat and pyrolyzing the first metal-containing coat to form a first metal-containing oxide film, a second metal-containing solution can be applied to form a second metal-containing coat. The second metal-containing coat can be pyrolyzed to form a second metal-containing film, and both the first and second metal-containing films can be calcined to form a compositionally uniform layer stack including first and second metal-containing oxide layers.

Electrodes can be coupled to the substrate and electrically connected to the metal-containing oxide layers. For example, a pair of electrodes can be coupled to the substrate prior to applying the first metal-containing coat to the substrate. The pair of electrodes can be coupled to the substrate by the first metal-containing oxide layer, such as by coupling the electrodes to the metal-containing oxide film subsequent to pyrolyzing the first metal-containing oxide coat. The pair of electrodes can be coupled to the substrate by both the first and second metal-containing oxide layers, such as by coupling the electrodes to the second metal-containing oxide film subsequent to pyrolysis or after calcining the first and second metal-containing metal oxide films. Coupling the electrodes can include developing the electrodes using a deposition technique.

In an aspect, the metal-containing solution can include both magnesium and zinc starting compounds. For example, the metal-containing solution can include a zinc source, like zinc 2-ethylhexanoate. The metal-containing solution can include a magnesium source, like magnesium 2-ethylhexanoate. The metal-containing solution can include a solvent, like toluene. The metal-containing solution can include a stabilizer.

In certain embodiments, the stabilizer can include a tri-functional chemical solution deposition additive with an amino alcohol. The amino alcohol can include one or more hydroxyl groups and one or more amines. The amino alcohol can include a primary amine, a primary amine and a secondary amine, or primary, secondary, and tertiary amines. The amino alcohol may include monoethanolamine, diethanolamine, triethanolamine, hetpaminol, isoetarine, noepinephrine, propanolamine, shphingosine, or methanolamine.

A method of stabilizing an organometallic precursor in a chemical solution deposition reaction includes adding a tri-functional chemical solution deposition additive to a metal-containing solution having a organometallic precursor prior to application of the metal-containing solution to a substrate. The organometallic precursor can be a metal 2-ethylhexanoate, such as magnesium 2-ethylhexanoate or zinc 2-ethylhexanoate. The tri-functional chemical solution deposition additive can be diethanolamine. The tri-functional chemical solution deposition additive can be added to the organometallic precursor in a ratio of between about 0.05 to 1 and about 1 to 1 of additive: total weight of all metals in the metal-containing solution. The tri-functional chemical solution deposition additive can be added to the organometallic precursor in a 1 to 1 ratio.

A method of increasing crystal growth in a chemical solution deposition reaction includes adding a tri-functional chemical solution deposition additive to the organometallic precursor prior to deposition. The tri-functional chemical solution deposition additive can be diethanolamine. The crystal can have a composition according to $Mg_xZn_{(1-x)}O$, x being between about 0.5 and about 0.8.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 6 is a diagram showing the effect of moisture infiltration into metal-containing solutions both having and lacking the stabilizer of FIG. 4, showing the stability and instability of the respective metal-containing solutions; and FIG. 7 is a plot showing an absorption spectrum of blue-shifted metal-containing oxide layer formed using an embodiment of the methods described herein.

DETAILED DESCRIPTION OF THE PREFERRED EMBODIMENTS

Figure 1:
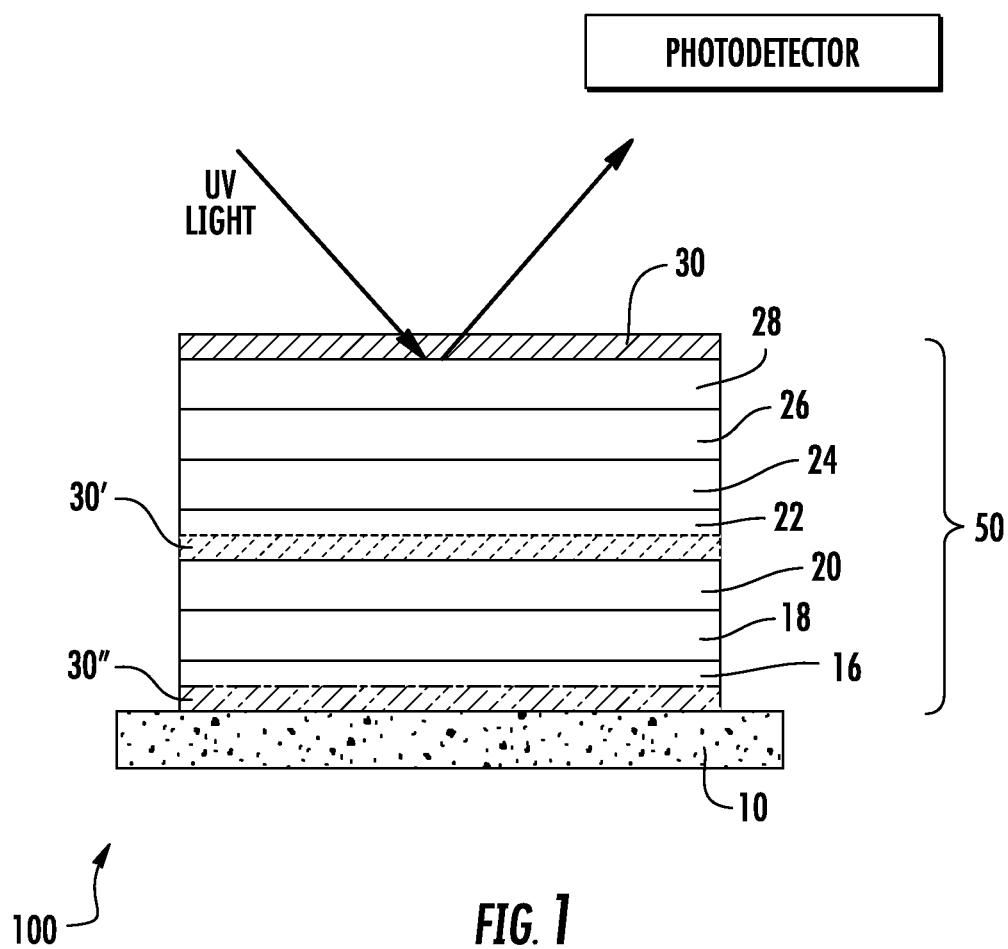
FIG. 1 is a schematic side elevation view of an ultraviolet (UV) photodetector in a accordance with the present disclosure, showing a stack of metal-containing oxide layers.

Reference will now be made to the drawings wherein like reference numerals identify similar structural features or aspects of the subject disclosure. For purposes of explanation and illustration, and not limitation, an exemplary embodiment of a an ultraviolet (UV) photodetector in accordance with the disclosure is shown in FIG. 1, and is designated generally by reference character 100. Other embodiments of UV photodetectors and methods making UV photodetectors in accordance with the disclosure, or aspects thereof, are provided in FIGS. 2-7, as will be described. The systems and methods described herein can be used in fire and flame detection devices, such as in residential settings. Referring now to FIG. 1, UV photodetector 100 generally includes a substrate 10, a layer stack 50 having a plurality of layers, and one or more electrodes 30. Substrate 10 structurally supports layer stack 50 and the one or more electrodes 30, and may include silicon or any other suitable structure. Layer stack 50 overlays substrate 10, and in the illustrated exemplary embodiment includes seven layers overlaying one another. In this respect a first layer 16 overlays substrate 10, a second layer 18 overlays first layer 16, a third layer 20 overlays second layer 18, a fourth layer 22 overlays third layer 20, a fifth layer 24 overlays fourth layer 22, a sixth layer 26 overlays fifth layer 24, and a seventh (or incident) layer 28 overlays sixth layer 26. As will be appreciated, UV photodetector may have one, two, or any number of layers as suitable for a given application.

The one or more electrodes 30 are coupled to substrate 10 through film stack 50, and are electrically connected to film stack 50. UV photodetector 100 is configured to selectively redirect incident UV radiation to a photodetector 36 that determines whether flame is present via state circuitry and/or software (not shown for reasons of clarity).

Figure 2A:
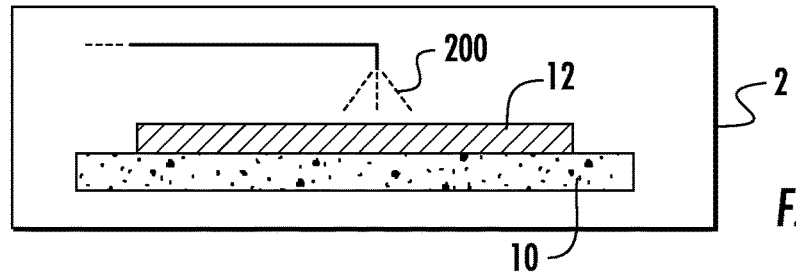
FIGS. 2A-2D schematically show an exemplary embodiment of a method of making the UV photodetector of FIG. 1, showing a substrate being spin coated with a metal-containing solution to form a metal-containing coat, the metal-containing coat being baked and thereafter pyrolized to form a metal-containing film, and the metal-containing film being calcined to form a metal-containing oxide layer.
Figure 2B:
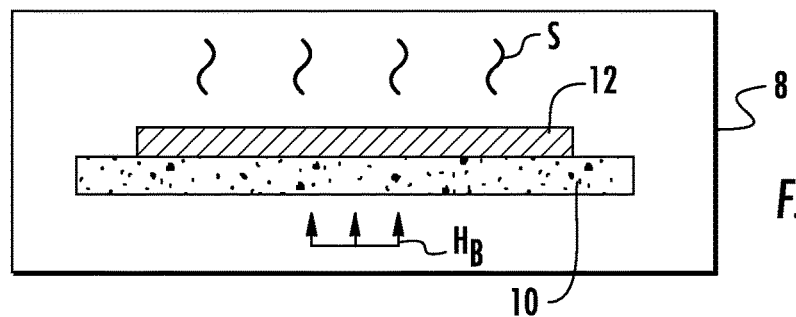
Figure 2C:
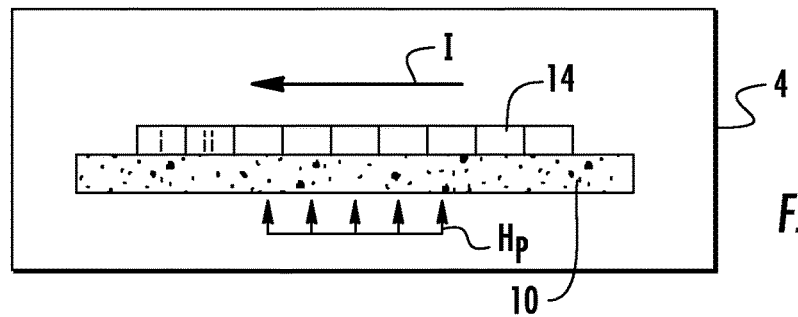
Figure 2D:
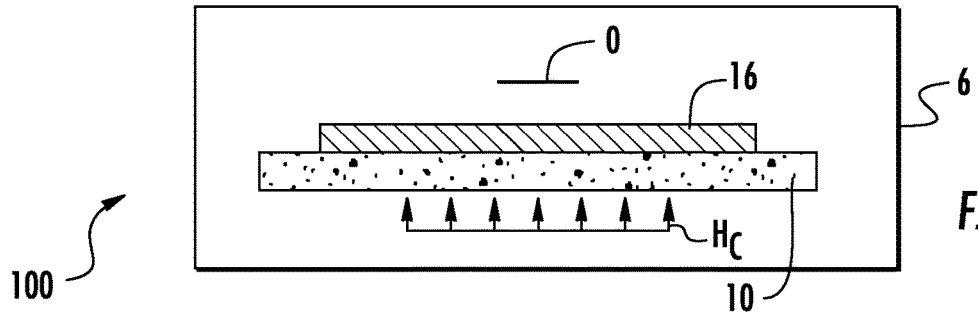

With reference to FIGS. 2A-2D, a method of making a UV photodetector is shown is generally indicated with reference numeral 100. As indicated in FIG. 2A, method 100 includes applying a metal-containing solution 200 to a substrate 10 using a spin coater 2. The applied metal-containing solution forms a metal-containing coat 12 overlaying substrate 10. As indicated in FIG. 2B, metal-containing coat 12 is then gently baked to drive out solvent S from metal-containing coat 12. As indicated in FIG. 2C, metal-containing coat 12 (shown in FIG. 2B) is pyrolyzed using a pyrolyzing furnace 4 to form a metal-containing film 14 with a polycrystalline structure having a cubic phase i and an amorphous phase ii. As indicated in FIG. 2D, the metal-containing film 14 (shown in FIG. 2C) is then calcined using a calcining furnace 6, thereby forming a metal-containing-layer 16 with a cubic crystalline structure I throughout.

Metal-containing solution 200 includes an organometallic precursor, such as a metal ion ligated or chelated by an organic moiety. In embodiments, metal-containing solution 200 includes one or more organometallic precursors with both magnesium and zinc in a predetermined ratio. Metal-containing film 14 includes a magnesium and zinc in a ratio corresponding to the predetermined ratio metal-containing solution 200. Metal-containing oxide layer 16 includes magnesium and zinc in a ratio corresponding to metal-containing film 14. The ratio of magnesium to zinc in the metal-containing solution, metal-containing film, and metal-containing oxide layer generally corresponds to $Mg_xZn_{(1-x)}O$.

Figure 3:
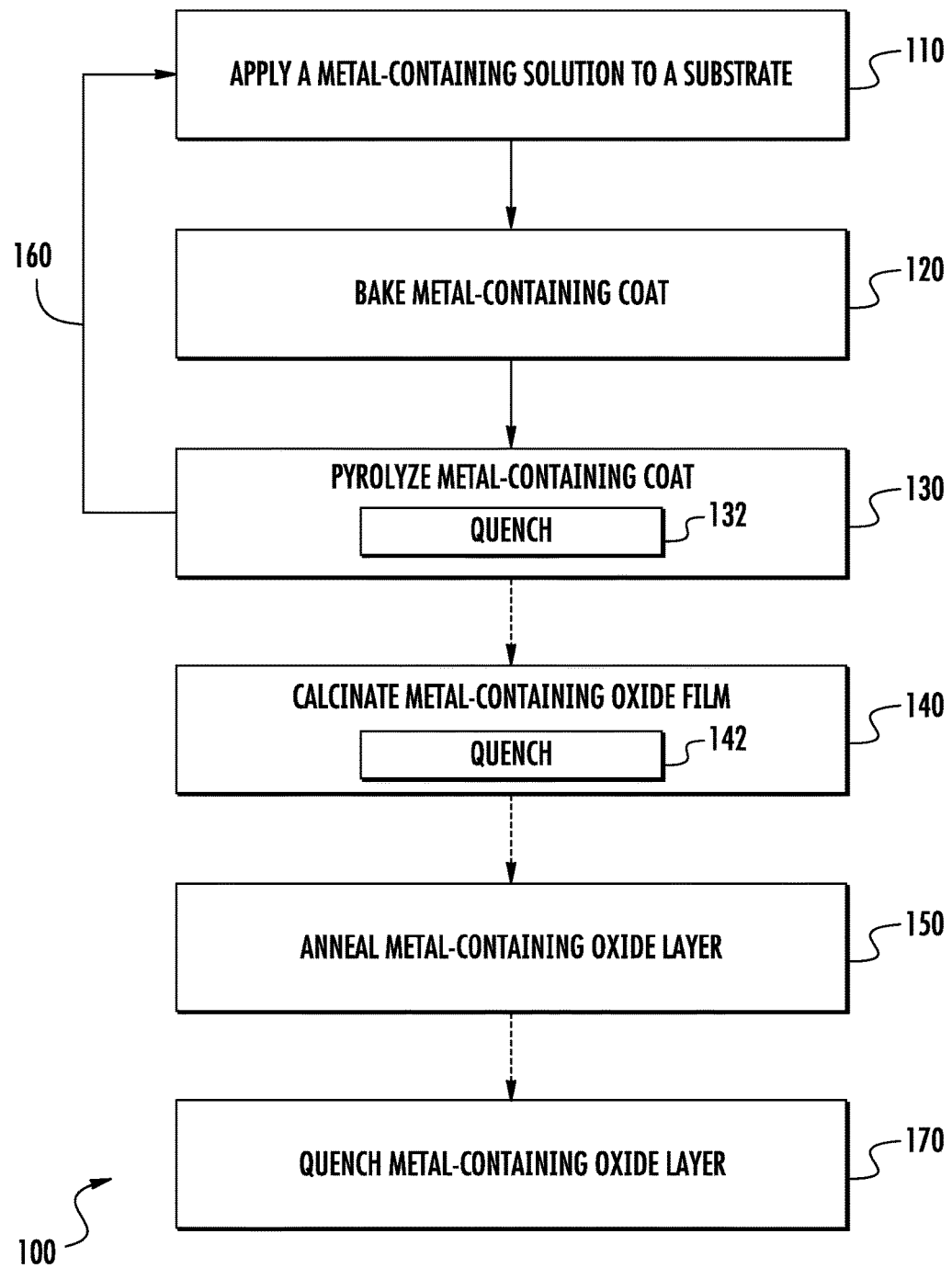
FIG. 3 is a process flow diagram of the method of making a UV photodetector of FIG. 1, showing operations of the method.

With reference to FIG. 3, method 100 is shown. As shown with box 110, method 100 includes applying a metal-containing solution to a substrate, e.g. metal-containing solution 200 and substrate 10 (both shown in FIG. 2A), using a chemical solution deposition (CSD) technique. This forms metal-containing coat 12 (shown in FIG. 2A). Metal-containing coat 12 can be gently baked, i.e. at a temperature that is lower than the pyrolyzing temperature, as shown with box 120, to drive solvent out of the metal-containing coat (also shown in FIG. 2B). The metal-containing coat is thereafter pyrolyzed, as shown in box 130, to form a metal-containing oxide film, e.g. metal-containing oxide film layer 14 (shown in FIG. 2C), to form a polycrystalline structure having both amorphous and cubic crystal microstructure therein. Optionally, as shown with box 132, the metal-containing film may be quenched subsequent to pyrolysis. Optionally, as shown with box 140, the metal-containing oxide film can be then calcined to form a metal-containing oxide layer with a cubic crystalline structure, e.g. metal-containing oxide layer 16 (shown in FIG. 2D). Optionally, as shown with box 142, the metal-containing layer may be quenched subsequent to calcining.

Method 100 can include developing a film stack on the substrate by successively applying the metal-containing solution to the underlying metal-containing oxide film to form an overlying metal-containing coat, and pyrolyzing the overlying metal-containing coat to form an overlying metal-containing oxide film, as indicated by arrow 160. In this respect, subsequent to pyrolyzing a first metal-containing coat disposed on the substrate, a second metal-containing coat can be applied over the first metal-containing oxide film. The second metal-containing coat can be pyrolyzed, thereby forming a film stack comprising first and second metal-containing oxide films overlaying the substrate. The film stacks can thereafter be calcined to form a layer stack, e.g. layer stack 50 (shown in FIG. 1), overlaying the substrate. In an exemplary embodiment, both the first and second metal-containing oxide films include magnesium-zinc oxide films.

Gently baking the metal-containing solution coating 120 can be done immediately after applying the metal-containing solution coating 12 (shown in FIG. 2A) to substrate 10 (shown in FIG. 2A). In embodiments, gently baking the metal-containing coat includes placing the metal-containing coat substrate on a hot plate pre-heated to a predetermined baking temperature for a predetermined baking interval. Gently baking the metal-containing coat drives the solvent from the coat and concentrates the metal-containing coat, rendering the metal-containing coat tacky such that additional layers may be deposited thereon, and ensuring that the metal-containing coat remains on the substrate—and not flow off the substrate. In an exemplary embodiment the hot plate can be preheated to a bake temperature of about 150 degrees Celsius. The metal-containing solution coated substrate may be left on the hot plate for a bake interval of about five (5) minutes.

With continuing reference to FIG. 3, pyrolyzing the metal-containing coat 130 includes placing the metal-containing solution coating in a pre-heated furnace, e.g. furnace 4 (shown in FIG. 2C). An inert gas I (shown in FIG. 2C) is flowed across the metal-containing coat while the metal-containing coat undergoes pyrolysis. Pyrolyzing the metal-containing coating in the presence of a dynamic, inert atmosphere decomposes without oxidizing or volatizing organic ligands present in the metal-containing coat. The inert gas may include argon, nitrogen, helium, or any other suitable inert gas.

Pyrolyzing the metal-containing coat can include placing the metal-containing coat in a furnace for between about five (5) minutes and ten (10) minutes after the furnace has been preheated to a predetermined pyrolyzing temperature that is between about 450 degrees Celsius and 550 degrees Celsius. Pyrolyzing the metal-containing coat at temperature in this range causes the metal-containing solution coating to begin to form a cubic crystalline structure, but is insufficient to cause the coating to fully crystallize in a cubic crystalline structure. As a result, a first metal-containing film formed from the pyrolysis operation has a polycrystalline structure with both cubic portions i and amorphous portions ii (both shown in FIG. 2C) that promote formation of a cubic crystalline structure in a second metal-containing oxide film subsequently formed and overlaying the first metal-containing oxide film. In contrast, pyrolization temperatures below 450 degrees Celsius may be insufficient to fully decompose organic ligands disposed within the metal-containing oxide layer; pyrolization temperatures above 550 degrees Celsius may cause decomposed organics to oxidize in a way that negatively impacts the calcining of the metal-containing oxide film. In an exemplary embodiment the furnace is preheated to a pyrolyzing temperature of about 500 degrees Celsius.

Optionally, metal-containing oxide film 14 (shown in FIG. 2C) is placed in calcining furnace 6 (shown in FIG. 2D) for about ten (10) minutes once the pyrolizing furnace has been preheated to about 750 degrees Celsius. Calcining can sharpen the absorption characteristics of the resulting metal-containing layer, the metal-containing layer thereafter absorbing UV radiation from a more narrow band of wavelengths than that absorbed in contemplated embodiments having only undergone pyrolysis.

Calcining the metal-containing oxide film includes placing the metal-containing oxide film in a calcining furnace, e.g. calcining furnace 6 (shown in FIG. 2D), for a predetermined calcining interval and predetermined calcining temperature. The calcining furnace has an oxygen-containing atmosphere O for a predetermined time interval once the furnace reaches a predetermined temperature. Oxygen-containing atmosphere O is static, for example by sealing the calcining furnace from the ambient environment, and contains 20% or more oxygen mixed with an inert gas. Calcining the metal-containing oxide film in a static atmosphere with an oxygen content of about 20% removes substantially all remaining organic ligands and interstitial zinc from metal-containing oxide film, the former promoting formation of a metal-containing oxide layers that have a cubic crystalline structure through—which, in the case of metal-containing oxide layers formed from magnesium-zinc oxides, rendering the layer solar blind.

Figure 4:
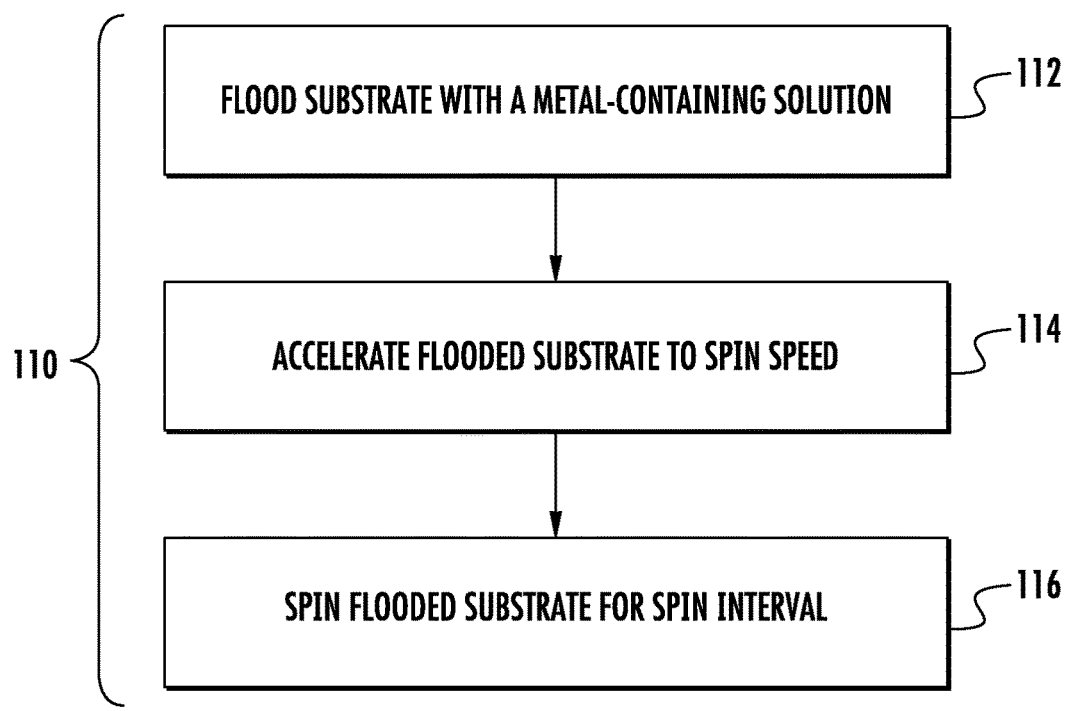
FIG. 4 is a process diagram of a chemical solution deposition technique for coating the substrate of FIG. 1, showing a spin coat technique.

Optionally, method 100 may include an annealing operation, as shown with box 150. Annealing 150 generally includes placing calcined metal-containing oxide layer 16 (shown in FIG. 2D) in an annealing furnace 6 (also shown in FIG. 2D) to improve the crystalline structure of the metal-containing oxide layer. It can also improve the visual quality of metal-containing oxide layer, such as by making the surface more smooth and defect free than could otherwise be the case. In embodiments, the annealing occurs in a static atmosphere furnace and entails placing the metal-containing oxide layer in the annealing furnace for an annealing interval of between thirty (30) minutes and four (4) hours after preheating the annealing furnace to an annealing temperature of between 200 degrees Celsius and about 400 degrees Celsius. Referring now to FIG. 4, applying a metal-containing solution to a substrate using a spin coat technique is shown. As shown with box 112, applying the metal-containing solution to the substrate includes flooding the substrate with the metal-containing solution. The flooded substrate is accelerated to a predetermined spin speed, as shown with box 114. Once reaching the predetermined spin speed, the flooded substrate is spun at the spin speed for a predetermined spin interval, as shown with box 116. Spinning metal containing solutions as described herein distributes the metal-containing solution as a metal-containing coat on the substrate such that the metal-containing oxide layer ultimate developed from the metal-containing solution coating has a thickness of about 50 nanometers. In an exemplary embodiment the predetermined spin speed is about 1,500 rotations per minute and the time interval is about thirty (30) seconds.

Figure 5:
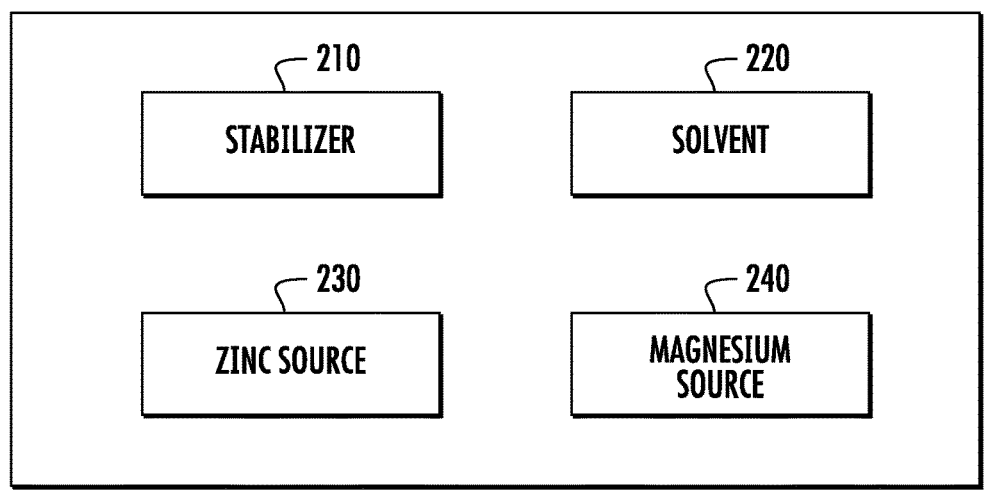
FIG. 5 is a schematic view of the metal-containing solution, showing organometallic precursors, a solvent, and a stabilizer.

With reference to FIG. 5, metal-containing solution 200 is shown. Metal-containing solution 200 includes a stabilizer 210, a solvent 220, a zinc source 230, and a magnesium source 240. Zinc source 230 includes a zinc organometallic precursor such as zinc acrylate, zinc 2-methoxyethoxide, zinc acetylacetonate, zinc caprylate, zinc isopropoxide, zinc methacrylate, zinc naphthenate, zinc neodecanoate, zinc octoate, zinc oleate, zinc oxalate, zinc picolinate, zinc stearate, zinc undecylenate, or any other suitable zinc organometallic precursor. Magnesium source 240 includes a magnesium organometallic precursor such as bis(2,2,6,6-tetramethyl-3,5-heptanedionato)magnesium, magnesium myristate, magnesium tert-butoxide, magnesium oxalate, magnesium ethoxide, magnesium formate, magnesium naphthenate, magnesium acetylacetonate, or any other suitable magnesium organometallic precursor. As will be appreciated by those of skill in the art in view of the present disclosure, the magnesium to zinc by mole ratio in metal-containing solution 200 varies according to the role a given metal-containing oxide layer plays in the layer stack ultimately developed on the substrate. Advantageously, spin coat techniques generally allows for application of metal-containing solution coatings with magnesium to zinc ratios that are between 0.5 to 0.5 and 0.8 to 0.2.

Referring to FIG. 6, the effect of stabilizer 210 on metal-containing solution 200 is shown. The shelf life of some metal-containing solutions can be influenced by moisture infiltration because infiltrating moisture can cause metal ions to be reduced and thus come out of solution as a precipitate, and alter the ratio of metals within the metal-containing solution. Since the ratio of metals in the metal-containing solution influences the spectral performance of the layer stack ultimately formed using the metal-containing solution, moisture infiltration can cause unintended changes in the tuning of a given detector. The left-hand side of FIG. 5 shows infiltrating moisture causing zinc ions to come out of a metal-containing solution having organometallic precursors, like metal 2-ethylhexanoates, such as magnesium 2-ethylhexanoate or zinc 2-ethylhexanoate, to come out of solution as a precipitate. As indicated on the right-hand side of FIG. 5, introducing stabilizer 210 reduces the tendency of moisture absorbed by the metal-containing solution to cause metal to precipitate out of the metal-containing solution.

Stabilizer 210 generally includes a tri-functional chemical solution deposition additive with an amino alcohol. The amino alcohol includes one or more hydroxyl groups and one or more amines. The amino alcohol also includes a primary amine, a primary amine and a secondary amine, or primary, secondary, and tertiary amines. The amino alcohol may include one or more of monoethanolamine, diethanolamine, triethanolamine, hetpaminol, isoetarine, noepinephrine, propanolamine, shphingosine, or methanolamine. The tri-functional chemical solution deposition additive can be diethanolamine. The tri-functional chemical solution deposition additive can be added to the organometallic precursor in a ratio of between about 0.05 to 1 and about 1 to 1 of additive to total weight of all metals in the solution. The tri-functional chemical solution deposition additive can be added to the organometallic precursor in a 1 to 1 ratio.

In an exemplary formulation, metal-containing solution 200 may have a total metal concentration of about 0.8 moles. In embodiments, metal-containing solution 200 includes 0.854 grams (0.009 moles) of diethanolamine, 3.58 milliliters of toluene, 4.829 grams (0.006 moles) of magnesium 2-ethylhexanoate (e.g. Strem 12-1260, 30-40 wt % in toluene, 2.9 wt % magnesium), and 0.647 grams (0.0022 moles) of zinc 2-ethylhexanoate.

In certain formulations, stabilizer 210 includes diethanolamine at an equimolar concentration to that of magnesium and zinc together. The equimolar concentration of diethanolamine with magnesium and zinc in metal-containing solution 200 prevents absorbed moisture from destabilizing the respective bonds between metals and 2-ethylhexanoate in metal-containing solution 200. In this respect diethanolamine operates as an electron donor, donating its electrons to the respective metal center bound thereto, strengthening the metal to ligand bond therebetween.

Stabilizer 210 includes diethanolamine. Diethanolamine enables metal-containing solution 200 to provide repeatable spin coat application during an extended shelf life interval. Diethanolamine, i.e. $HN(CH_2CH_2OH)_2$, is an amino alcohol like monoethanolamine, triethanolamine, hetpaminol, isoetarine, norepinephrine, propanolamine, sphingosine, and methanolamine that carry a hydroxide (—OH) and an amino (—NH2, NHR, or —NR2) functional groups on an alkane backbone. When incorporated into metal-containing solution 200, diethanolamine performs three functions.

First, diethanolamine functions as a structure stabilizer before and during spin coating that prevents moisture from the ambient environment attacking the organometallic precursors, particularly zinc sources such as zinc-2-ethylhexanoate compound. This prevents formation of 2-ethylexanoic acid and zinc ions—which would then get reduced and precipitate from the solution as zinc or zinc hydroxide. Stabilizer 210 also acts an electron donor to the zinc atom attached to the 2-ethylhexanoate ligands, forming a stronger bond to the 2-ethylhexanoate ligands, and preventing decomposition and thus loss of zinc.

Second, diethanolamine functions as a rheology aid before and during spin coating. In conventional form, metal sources such as metal 2-ethylhexanoates are relatively viscous and incompatible with conventional spin coating techniques. Viscosity is ordinarily reduced in such solutions using solvents like toluene, which is miscible with the organometallic precursor chemicals of metal-containing solution 200, has a low boiling point, and leaves substantially no additional elements or associated imperfections in films produced from solutions containing the solvent. Stabilizer compounds such as diethanolamine reduce the viscosity of metal sources like 2-ethylhexanoates more effectively than solvents like toluene, allowing for formulation of metal-containing solutions with greater metal source concentrations than otherwise possible using solvents like toluene.

Finally, diethanolamine functions as a crystal growth aid. Magnesium-zinc oxides typically form with hexagonal crystalline structure (wurtzite) with interstitial zinc distributed within the crystal phase. The interstitial zinc must be liberated from the crystalline structure during the pyrolysis, calcination, and/or annealing in order for the crystalline structure to 'relax' and adopt a cubic structure—which is solar blind, as shown in FIG. 6. Liberating the interstitial zinc requires energy, which applicants believe is provided by diethanolamine—by burning off to form volatile products, thereby facilitating conversion of the hexagonal structure into cubic structure with consistency sufficient to render resulting magnesium-zinc oxide solar blind.

In embodiments of methods described herein, methods for making metal-containing oxide layers with UV to visible spectra with peak absorption of about 185 nanometers, tunable peak width, and an absorption cutoff at about 290 nanometers using a chemical solution deposition process, like spin coating, are described. It is contemplated that metal-containing oxide layers made using the methods described herein can have substantially pure cubic structure, and may, in certain embodiments, have a composition of $Mg_{0.79}Zn_{0.21}O$. This can simplify the fabrication of the devices by reducing the need to make such coatings from chemical vapor deposition, molecular beam epitaxial, or sputtering techniques. It can also reduce the cost of UV photodetectors made from such methods, allowing the detection capability of such devices to be inserted in flame detection devices suitable for residential settings.

The methods and systems of the present disclosure, as described above and shown in the drawings, provide methods for making UV photodetectors with superior properties including a process routes for making such devices with layers having a composition according to $Mg_xZn_{(x-1)}O$ using CSD techniques. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of making an ultraviolet (UV) photodetector, comprising:
    applying a metal-containing solution to a substrate using a spin coat technique to form a metal-containing coat, wherein the metal-containing solution comprises a stabilizer;
    baking the metal-containing coat;
    pyrolyzing the metal-containing coat to form a metal-containing oxide film according to $Mg_xZn_{(1-x)}O$ with a cubic crystalline structure; and
    calcining the metal-containing oxide film to form a metal-containing oxide layer.

2. The method as recited in claim 1, wherein applying the metal-containing solution includes applying the metal-containing solution over a metal-containing oxide film.

3. The method as recited in claim 1, wherein the metal-containing oxide film is a first metal-containing oxide film, and further including:
    applying a metal-containing solution having magnesium and zinc to the first metal-containing oxide film using a spin coat technique; and
    pyrolyzing the applied metal-containing solution to form a second metal-containing oxide film overlaying the first metal-containing oxide film.

4. The method as recited in claim 3, further including calcining the metal-containing oxide film to form a second metal-containing oxide layer.

5. The method as recited in claim 1, wherein baking includes a predetermined baking temperature of about 150 degrees Celsius and a predetermined baking time interval of about five (5) minutes.

6. The method as recited in claim 1, wherein pyrolyzing the metal-containing coat includes placing the metal-containing coat in a furnace and flowing an inert gas over the metal-containing coat to decompose, but not oxidize or make volatile organic ligands in the metal-containing coat.

7. The method as recited in claim 6, wherein the inert gas includes a gas from a group nitrogen, argon, and helium.

8. The method as recited in claim 6, further including pyrolyzing the metal-containing coat at a temperature that is between about 450 degrees Celsius and about 550 degrees Celsius.

9. The method as recited in claim 6, further including pyrolyzing the metal-containing coat for a pyrolyzing time interval that is between about five (5) minutes and about thirty (30) minutes.

10. The method as recited in claim 6, further including pyrolyzing the metal-containing coat at about 500 degrees Celsius for about five (5) minutes.

11. The method as recited in claim 4, wherein calcining includes placing the metal-containing oxide film in a furnace with oxygen-containing atmosphere to oxidize and remove interstitial zinc from the metal-containing oxide film.

12. The method as recited in claim 11, wherein the oxygen-containing atmosphere comprises oxygen at a concentration that twenty (20) percent or greater.

13. The method as recited in claim 4, wherein calcining includes placing the metal-containing oxide film in a furnace pre-heated to a calcining temperature of between about 650 degrees Celsius and about 750 degrees Celsius.

14. The method as recited in claim 4, wherein calcining includes placing the metal-containing oxide film in a furnace for a calcining time interval of between about ten (10) minutes and about thirty (30) minutes.

15. The method as recited in claim 4, wherein calcining includes placing the metal-containing oxide film in a furnace pre-heated to about 750 degree Celsius for about ten (10) minutes.

16. The method as recited in claim 1, further including annealing the metal-containing oxide film.

17. The method as recited in claim 16, wherein annealing includes placing the metal-containing oxide layer in a furnace with a static atmosphere.

18. The method as recited in claim 16, wherein annealing includes placing the metal-containing oxide layer in a furnace with a temperature between about 200 degrees Celsius and about 400 degrees Celsius for between about thirty (30) minutes and about four (4) hours.

19. The method as recited in claim 1, further including quenching the metal-containing oxide film.

20. The method as recited in claim 1, wherein the metal-containing solution includes an organometallic magnesium source, and organometallic zinc source, a solvent, and a stabilizer.

21. The method as recited in claim 1, wherein the metal-containing solution includes at least one of diethanolamine, toluene, zinc 2-ethylhexanoate, and magnesium 2-ethylhexanoate.

22. The method as recited in claim 1, wherein the metal-containing solution includes magnesium and zinc in a ratio range between about 0.5 to 0.5 and about 0.8 to 0.2.

23. The method as recited in claim 1, wherein the metal-containing solution includes magnesium and zinc in a ratio of about 0.72 to 0.28.

24. The method as recited in claim 1, wherein the stabilizer comprises a tri-functional chemical solution deposition additive having an amino alcohol.

25. The method as recited in claim 24, wherein the amino alcohol comprises one or more hydroxyl groups.

26. The method as recited in claim 24, wherein the amino alcohol comprises a primary amine.

27. The as recited in claim 24, wherein the amino alcohol comprises a secondary amine.

28. The method as recited in claim 24, wherein the amino alcohol comprises a tertiary amine.

29. The method as recited in claim 24, wherein the amino alcohol is monoethanolamine, diethanolamine, triethanolamine, hetpaminol, isoetarine, noepinephrine, propanolamine, shphingosine, or methanolamine.

30. The method as recited in claim 1, wherein the stabilizer comprises a tri-functional chemical solution deposition additive, and further comprising adding the tri-functional chemical solution deposition additive to a solution of organometallic precursor prior to deposition to form the metal-containing solution.

31. The method as recited in claim 30, wherein the organometallic precursor is a metal 2-ethylhexanoate.

32. The method as recited in claim 31, wherein the metal 2-ethylhexanoate is magnesium 2-ethyl hexanoate or zinc 2-ethylhexanoate.

33. The method as recited in claim 24, wherein the tri-functional chemical solution deposition additive includes diethanolamine.

34. The method as recited in claim 24, wherein the tri-functional chemical solution deposition additive is added to the organometallic precursor in a ratio of between 0.05 to 1 and 1 to 1 of additive to total weight of all metals in the solution.

35. The method as recited in claim 24, wherein the tri-functional chemical solution deposition additive is added to the organometallic precursor in a 1 to 1 ratio.

* * * * *